(12) United States Patent
Lee

(10) Patent No.: US 9,906,192 B2
(45) Date of Patent: Feb. 27, 2018

(54) AMPLIFIER FOR VEHICLE AND VEHICLE INCLUDING THE SAME

(71) Applicant: HYUNDAI MOTOR COMPANY, Seoul (KR)

(72) Inventor: Seung Woo Lee, Gumi-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days.

(21) Appl. No.: 15/344,988

(22) Filed: Nov. 7, 2016

(65) Prior Publication Data

US 2017/0317649 A1   Nov. 2, 2017

(30) Foreign Application Priority Data

Apr. 29, 2016   (KR) .................. 10-2016-0052763

(51) Int. Cl.
*H04R 3/00* (2006.01)
*H03F 99/00* (2009.01)
(Continued)

(52) U.S. Cl.
CPC ........ *H03F 1/0227* (2013.01); *B60L 11/1868* (2013.01); *H03F 3/187* (2013.01); *H04R 3/12* (2013.01); *H04R 2499/13* (2013.01)

(58) Field of Classification Search
CPC . H04R 3/00; H04R 3/007; H04R 3/12; H04R 2499/13; H03F 1/0227;
(Continued)

(56) References Cited

U.S. PATENT DOCUMENTS

2008/0003959 A1*  1/2008  Lee .................. H03F 3/217
                                                  455/127.1
2008/0055946 A1*  3/2008  Lesso ............... H02M 3/158
                                                  363/63
(Continued)

FOREIGN PATENT DOCUMENTS

JP            5-58227 A      3/1993
JP       2002-043856 A       2/2002
(Continued)

OTHER PUBLICATIONS

Notice of Allowance issued in corresponding Korean Patent Application No. 10-2016-0052763, dated Nov. 1, 2017.

*Primary Examiner* — Thang Tran
(74) *Attorney, Agent, or Firm* — McDermott Will & Emery LLP

(57) ABSTRACT

The present disclosure provides an amplifier for vehicle, vehicle including the amplifier, and method for controlling the amplifier for vehicle, which uses a 48 volt (V) battery voltage and adjusts speaker output according to variable audio signals, thereby minimizing the size of the amplifier, reducing conversion loss of a Direct Current (DC)-to-DC converter, and increasing output efficiency. In accordance with one aspect of the present disclosure, An amplifier for vehicle includes a first input port for receiving a first voltage; a second input port for receiving a second voltage lower than the first voltage; at least one power Integrated Chip (power IC) connected to a speaker for using a voltage received from the first input port; and a controller for controlling the power IC using a voltage received from the second input port.

20 Claims, 9 Drawing Sheets

(51) Int. Cl.
  *B60L 11/00* (2006.01)
  *H03F 1/02* (2006.01)
  *H04R 3/12* (2006.01)
  *H03F 3/187* (2006.01)
  *B60L 11/18* (2006.01)

(58) Field of Classification Search
  CPC ......... H03F 3/183; H03F 3/187; H03G 3/004; B60L 11/123; B60L 11/1868
  See application file for complete search history.

(56) References Cited

U.S. PATENT DOCUMENTS

| | | | |
|---|---|---|---|
| 2008/0084166 A1* | 4/2008 | Tsai | G09G 3/10 315/160 |
| 2008/0116979 A1* | 5/2008 | Lesso | H03F 1/025 330/297 |
| 2010/0166226 A1 | 7/2010 | Kikkawa et al. | |
| 2014/0169588 A1* | 6/2014 | Petersen | H03F 3/68 381/120 |
| 2015/0198986 A1* | 7/2015 | Chang | G06F 1/26 713/330 |
| 2016/0373070 A1* | 12/2016 | Namekawa | H04R 3/12 |

FOREIGN PATENT DOCUMENTS

| | | |
|---|---|---|
| JP | 2006-319428 A | 11/2006 |
| JP | 2010-028201 A | 2/2010 |
| JP | 2010-157861 A | 7/2010 |
| JP | 2010-166544 A | 7/2010 |
| JP | 2014-132735 A | 7/2014 |
| KR | 10-2013-0051046 A | 5/2013 |

* cited by examiner

FIG. 8

| TECHNOLOGY OF PRESENT DISCLOSURE | COMPARISION WITH CONVENTIONAL AMP | EFFECT OF PRESENT DISCLOSURE | |
|---|---|---|---|
| 2 INPUT PORTS FOR 48V AND 12V | OMIT BUCK CIRCUIT FOR VOLTAGE DROP | OPTIMIZE SIZE OF AMP SYSTEM FOR VEHICLE AND SAVE COST | |
| | OMIT VOLTAGE BOOST CIRCUIT | SAVE COST | |
| DIRECTLY CONNECT 48V TO POWER IC | OMIT EXTRA IC TO INCREASE OUTPUT OF CONVENTIONAL 12V AMPLIFIER | SAVE COST | |
| | REDUCED CONVERTER CONVERSION LOSS AND REDUCED DIAMETER OF WIRE | HIGH EFFICIENCY, HIGH OUTPUT AMP | DC/DC CONVERSION EFFICIENCY INCREASED BY 90% |
| | | | CURRENT INCREASED BY 38% (23.2A→9A) |
| POWER MAX CONTROL OF CONTROLLER | | EFFICIENT POWER MANAGEMENT | |

AMPLIFIER FOR VEHICLE AND VEHICLE INCLUDING THE SAME

CROSS-REFERENCE TO RELATED APPLICATION

This application claims priority to and the benefit of Korean Patent Application No. 10-2016-0052763, filed on Apr. 29, 2016, the disclosure of which is incorporated herein by reference in its entirety.

TECHNICAL FIELD

The present disclosure relates to an amplifier for vehicle powered by a 48 V battery, vehicle including the amplifier, and method for controlling the amplifier.

BACKGROUND

Vehicles commonly use 12 volt (V) batteries as a power supply. The battery supplies power to various electronic control units (ECUs) installed in the vehicle.

The ECU is a computer-based device to control states of engine, automatic transmission, etc., of the vehicle, and the control plane of the ECU keeps expanding. With increased ECU and electronic parts for vehicle, the common 12V batteries have capacity limitations.

Insufficient battery capacity leads to problems of a shorter life and frequent discharging of the battery, decrease in fuel efficiency for charging an alternator of the vehicle, etc.

To address the problems, there is a road map planned to replace the 12V battery by a 48V battery in the vehicle, and accordingly, electronic parts for the vehicle are also changing to accept the voltage 48V.

Among electronic multimedia parts for vehicle, an amplifier (AMP) in particular, typically consumes the majority of current of the battery and is requested to accept the 48V battery voltage.

SUMMARY

The present disclosure provides an amplifier for vehicle, vehicle including the amplifier, and method for controlling the amplifier for vehicle, which uses a 48 volt (V) battery voltage and adjusts speaker output according to variable audio signals, thereby minimizing the size of the amplifier, reducing conversion loss of a Direct Current (DC)-to-DC converter, and increasing output efficiency.

In accordance with one aspect of the present disclosure, An amplifier for vehicle includes a first input port for receiving a first voltage; a second input port for receiving a second voltage lower than the first voltage; at least one power Integrated Chip (power IC) connected to a speaker for using a voltage received from the first input port; and a controller for controlling the power IC using a voltage received from the second input port.

The amplifier for vehicle may further include an audio digital signal processor (DSP) for receiving an audio source delivered to the amplifier and determining a sound source level based on the audio source.

The controller may control an extent of amplification of the power IC based on the sound source level determined by the audio DSP.

The controller may control the audio DSP to decrease the sound source level, in response to a determination that the extent of amplification of the power IC based on the sound source level exceeds an allowable input level of the speaker.

The amplifier for vehicle may further include a direct current (DC)-to-DC converter for dropping the second voltage received through the second input port.

The audio DSP and the controller may operate at a voltage applied by the DC-to-DC converter.

In accordance with another aspect of the present disclosure, a vehicle includes a battery for supplying a voltage; a first direct current (DC)-to-DC converter that drops a first voltage applied by the battery; an amplifier that operates at a voltage applied by the battery; and a speaker that outputs sound based on controlling of the amplification. The amplifier comprises a first input port for receiving the first voltage; a second input port for receiving a second voltage dropped by the first DC-to-DC converter; at least one power Integrated Chip (power IC) connected to the speaker for using a voltage received from the first input port; and a controller for controlling the power IC using a voltage received from the second input port.

The vehicle may further include an audio digital signal processor (DSP) for receiving an audio source delivered to the amplifier and determining a sound source level based on the audio source.

The controller may control an extent of amplification of the power IC based on the sound source level determined by the audio DSP.

The controller may control the audio DSP to decrease the sound source level, in response to a determination that the extent of amplification of the power IC based on the sound source level exceeds an allowable input level of the speaker.

The first voltage may include a 48V battery voltage.

The amplifier may further include a second DC-to-DC converter for further dropping the second voltage received through the second input port.

The audio DSP and the controller may operate at a voltage applied by the DC-to-DC converter.

In accordance with another aspect of the present disclosure, a first battery that supplies a first voltage; a second battery that supplies a voltage lower than the first voltage supplied by the first battery; an amplifier that operates at voltages supplied by the first and second batteries; and a speaker that outputs sound based on controlling of the amplification. The amplifier comprises a first input port for receiving the first voltage; a second input port for receiving a second voltage lower than the first voltage; at least one power Integrated Chip (power IC) connected to the speaker for using a voltage received from the first input port; and a controller for controlling the power IC using a voltage received from the second input port.

The vehicle may further include an audio digital signal processor (DSP) for receiving an audio source delivered to the amplifier and determining a sound source level based on the audio source.

The controller may control an extent of amplification of the power IC based on the sound source level determined by the audio DSP.

The controller may control the audio DSP to decrease the sound source level, in response to a determination that the extent of amplification of the power IC based on the sound source level exceeds an allowable input level of the speaker.

The first voltage may include a 48V battery voltage.

The amplifier may further include a direct current (DC)-to-DC converter for further dropping the second voltage received through the second input port.

The audio DSP and the controller may operate at a voltage applied by the DC-to-DC converter.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 8 is a table for explaining effects of an amplifier for vehicle, according to an embodiment of the present disclosure.

DETAILED DESCRIPTION OF EXEMPLARY EMBODIMENTS

Figure 1:
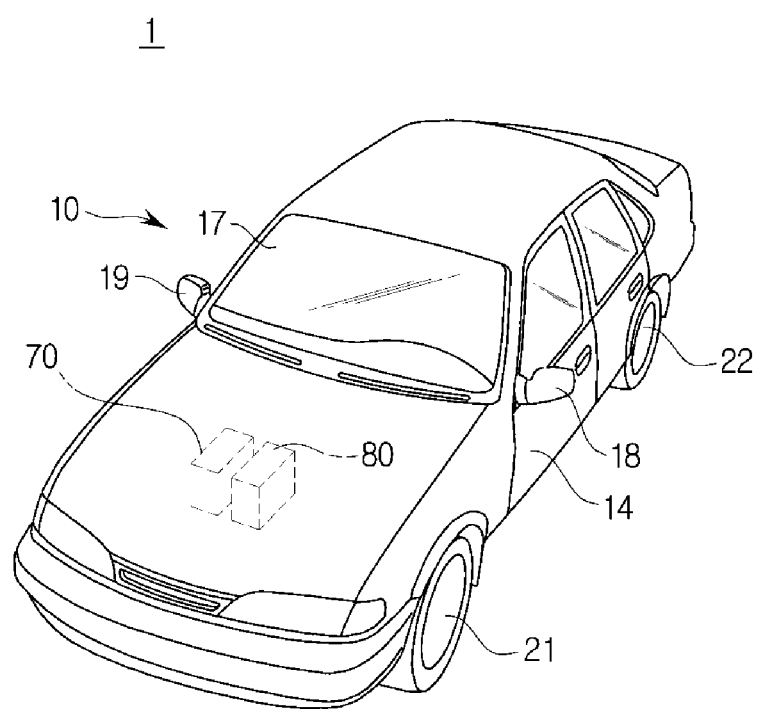
FIG. 1 illustrates an exterior view of a vehicle, according to an embodiment of the present disclosure.

Embodiments and features as described and illustrated in the present disclosure are only preferred examples, and various modifications thereof may also fall within the scope of the disclosure.

Throughout the drawings, like reference numerals refer to like parts or components.

The terminology used herein is for the purpose of describing particular embodiments only and is not intended to limit the present disclosure. It is to be understood that the singular forms "a," "an," and "the" include plural references unless the context clearly dictates otherwise. It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or section discussed below could be termed a second element, component, region, layer or section without departing from the teachings of the present disclosure. Descriptions shall be understood as to include any and all combinations of one or more of the associated listed items when the items are described by using the conjunctive term "~ and/or ~," or the like.

Embodiments of an amplifier for vehicle, and vehicle including the amplifier will now be described in detail with reference to the accompanying drawings.

FIG. 1 illustrates an exterior view of a vehicle, according to an embodiment of the present disclosure.

Referring to FIG. 1, a vehicle 1 includes a main body 10 that constitutes the exterior of the vehicle 1, wheels 21 and 22 for moving the vehicle 1, a driving system (not shown) for rotating the wheels 21 and 22, doors 14 for shielding the interior of the vehicle 1 from the outside, a front window 17 through which the driver can see a view ahead of the vehicle 1, side mirrors 18 and 19 for helping the driver see areas behind and to the sides of the vehicle 1.

The wheels 21 and 22 include front wheels 21 and rear wheels 22, and the driving system transfers turning forces to the front wheels 21 or rear wheels 22 to move the vehicle 1 forward or backward. The driving system may employ a motor that produces the turning force from electrical power supplied from a storage battery (not shown) or a combustion engine (not shown) that burns a fuel to produce the turning force.

The doors 14 are pivotally attached onto the left and right sides of the main body 10, and opened for the driver or passengers to enter and exit the vehicle 1 and closed for shielding the interior of the vehicle 1 from the outside.

The front glass 17, also termed as a windshield glass, is placed on the upper front of the main body 10 for securing front views for the driver and passenger inside the vehicle 1.

The side mirrors 18 and 19 includes a left side mirror 18 and a right side mirror 19 placed on the left and right sides of the main body 1, respectively, for helping the driver obtain views behind and to the sides of the vehicle 1.

In addition, the vehicle 1 may include sensing devices, such as an approximation sensor for detecting an obstruction or other cars behind the vehicle 1, a rainfall sensor for detecting precipitation and whether it is raining, etc.

For example, the approximation sensor may send out a detection signal from the side or from the rear of the vehicle 1 and receive a reflection signal reflected from an obstruction or another vehicle. Based on the waveform of the received reflection signal, the vehicle 1 may determine whether there is another vehicle or obstruction behind the vehicle 1 and the position of the vehicle or obstruction. The approximation sensor may employ a scheme of detecting a distance to the other car or obstruction by sending out ultrasound and receiving echo ultrasound reflected from the car or obstruction.

In an embodiment, the vehicle 1 may include one or more batteries to supply power to the vehicle 1. As shown in FIG. 1, the vehicle 1 may include two batteries 70, 80. The first one of the two batteries may provide a first voltage, and the second battery may provide a voltage lower than the first voltage. The first and second batteries supply power required for Electronic Control Units (ECUs) installed in the vehicle 1.

The batteries may have different sizes and types, and in another embodiment of the present disclosure, only a single battery 80 that provides the first voltage may be used. This will be described in detail later in connection with FIGS. 6A and 6B.

In an embodiment, the first voltage may be 48 volt (V), and the second voltage may be a voltage lower than 48V, e.g., 3V, 12V, or 24V. The second voltage may have any level so long as it is lower than the first voltage. In the following description, it is assumed that the first voltage is 48V and the second voltage is 12V.

If the ECU and an amplifier (AMP) built into the vehicle 1 require lower voltages than 48V, e.g., 5V, 12V, and 24V, an extra buck circuit is configured or a Direct Current (DC)-to-DC converter may be employed in the 48V battery 80 to drop the voltage.

The voltages of the batteries 70, 80 as will be described are only by way of example, and they may have other various voltage levels. Such a battery and components of the vehicle 1 that use a voltage from the battery will be described in detail in connection with FIG. 3.

Figure 2:
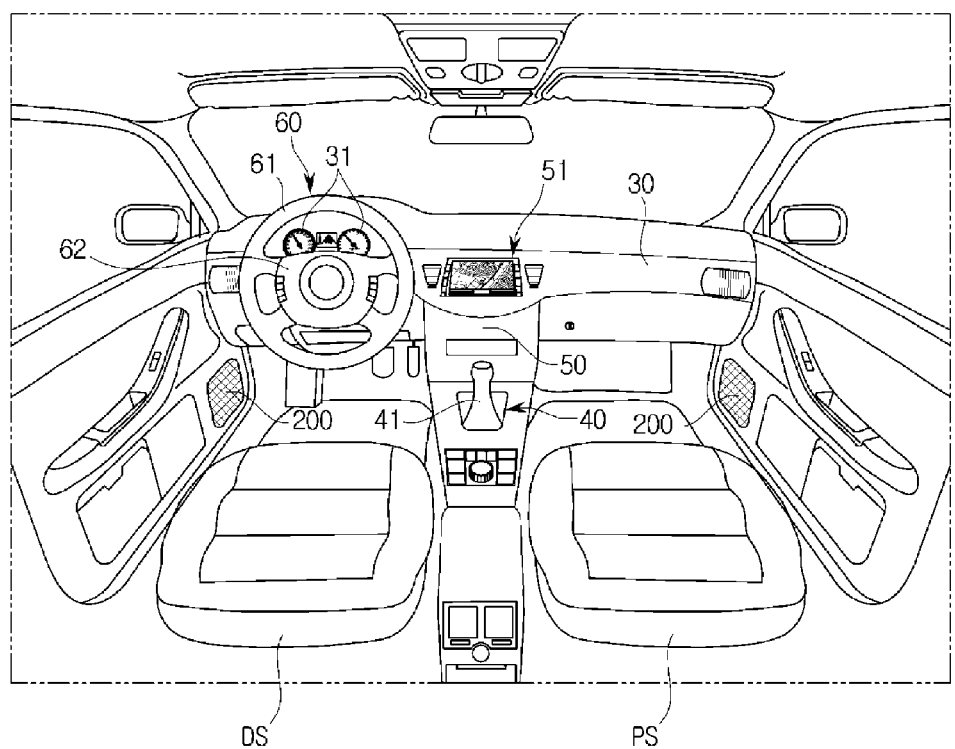
FIG. 2 illustrates an interior view of a vehicle, according to an embodiment of the present disclosure.

FIG. 2 illustrates an interior view of a vehicle, according to an embodiment of the present disclosure.

Referring to FIG. 2, inside the vehicle 1, there may be seats DS, PS, a dashboard 30 having various instruments and gauges for controlling operation of the vehicle 1 and indicating driving information of the vehicle 1, and a steering wheel 60 manipulated by the driver for steering control.

The seats may include a driver seat DS, a passenger seat PS, and back seats (not shown) located in the back inside the vehicle 1.

The dashboard 30 may be equipped with an instrument panel 31 including a speed gauge, a fuel gauge, an automatic gear shift indicator, a taco meter, a trip odometer, etc., for indicating information relating to traveling, a gearbox 40, a center fascia 50, etc.

The gearbox 40 includes transmission gears 41 for gear shifting. Furthermore, as shown in FIG. 2, an input device may be installed to receive commands from the user to control an Audio Video Navigation (AVN) device 51 or key functions of the vehicle 1.

The center fascia 50 may be equipped with an air conditioning (AC) system, a clock, and the AVN device 51. The AC system keeps the atmosphere inside the vehicle 1 pleasant by controlling temperature, humidity, air cleanness, and air flows inside the vehicle 1. The air conditioner may include at least one vent installed in the center fascia 50 for venting air. There may also be buttons or dials installed in the center fascia 50 to control e.g., the AC system. The driver or the user may control the AC system of the vehicle 1 by means of the buttons or dials arranged on the center fascia 50.

The AVN device 51 may refer to a head unit built into the dashboard 30 of the vehicle 1 or detachably installed in the vehicle 1 for controlling general operation of the various electronic parts of the vehicle 1.

Specifically, the AVN device 51 is a system in which audio and multimedia devices and a navigation (or GPS) system of the vehicle 51 are integrated together, for providing a radio tuning service for the driver to tune in and listen to a radio channel serviced from one of terrestrial radio stations, an audio service for playing e.g., Compact Disks (CDs), a video service for playing e.g., Digital Versatile Disks (DVDs), a navigation service for giving the driver directions to a destination, a telephone service for controlling whether to receive an incoming call to a mobile terminal connected to the vehicle 1, and the like.

In addition, the AVN device 51 may also provide a voice recognition service for receiving voice commands rather than the user's manipulation to provide the radio, audio, video, navigation, and telephone services.

The AVN device 51 may have e.g., a Universal Serial Bus (USB) port to be connected to a portable multimedia device such as a Portable Multimedia Player (PMP), an MPEG Audio Layer-3 (MP3) player, a Personal Digital Assistant, etc., for reproducing audio and video files.

The user may be served radio, audio, video, and/or navigation services through the AVN device 51. The audio service may be provided to the user through an amplifier 100 of FIG. 4 connected to the AVN device 51.

The amplifier 100 refers to a device for amplifying signals from the AVN device 51.

When the head unit or AVN device 51 sends data like a sound source to the amplifier 100, the amplifier 100 amplifies the signal and sends the amplified signal to the speaker 200, which in turn produces sound from the signal.

The amplifier 100 installed in the vehicle 1 may be a name of general audio system even including an audio Digital Signal Processing (DSP) 105, and may include a frequency adjustment or tuning function in addition to the function of amplifying the sound signal.

The speaker(s) 200 connected to the amplifier 100 for outputting sound may be installed in the bottom of the seats DS, PS and on the doors 14.

The speaker 200 produces sound from the sound signal amplified by the amplifier 100 by converting the sound signal sent from the amplifier 100 to vibration on a diaphragm to radiate sound waves into the air.

An audio service reproduced through the speaker 200 may include an alarm to be output from the vehicle 1 in addition to music data delivered by the AVN device 51, without being limited thereto.

The amplifier 100 and the speaker 200 will be described in detail later in connection with FIG. 4.

Meanwhile, the center fascia 50 may be equipped with an input unit to control the AVN device 51. The input unit 51 may be installed in a place other than the center fascia 50.

For example, the input unit of the AVN device 51 may be formed around a display of the AVN device 51. In another example, the input unit of the AVN device 51 may be installed on the gear box 40.

The steering wheel 60 is a tool to control a traveling direction of the vehicle, and may include a rim 61 to be held by the driver and a spoke 62 connected to a steering system of the vehicle for connecting the rim 61 to a hub of a rotation shaft for steering. In an embodiment, control devices may be formed on the spoke 62 to control various devices, e.g., the AVN device 51.

The display displays images of various functions running in the AVN device 51 according to the user's manipulation. For example, the display may selectively display at least one of audio, video, navigation, and call screens, and may also display various control screens related to controlling the vehicle 1 or screens related to additional function that may be executed in the AVN device 51.

Although not described in connection with FIG. 2, other various arrangements and devices may be included in the vehicle 1.

Figure 3:
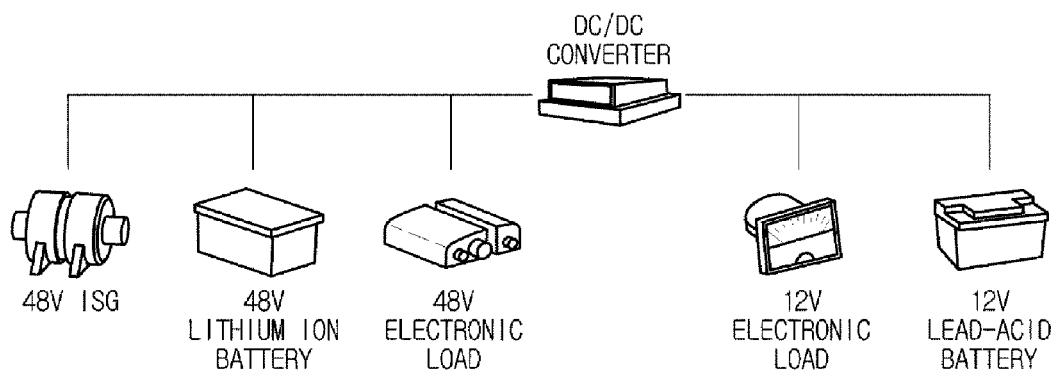
FIG. 3 illustrates various electronic parts connected to a battery in a vehicle.

FIG. 3 illustrates various electronic parts connected to a battery in a vehicle.

As described above, various electronic parts or ECUs that receive power from the battery 70, 80 for operation are installed in the vehicle 1. Voltages or currents required for the electronic parts may have many different levels depending on the size and function of the electronic parts.

For example, in FIG. 3, 12V electronic devices may be control devices for power train, body, and chassis, and driver assistant devices. It is common for these electronic devices to use the voltage 12V.

Recently, 48V electronic devices have been installed in the vehicle 1 to improve fuel efficiency.

In FIG. 3, 48V Idle Stop and Go (ISG) is a control device to automatically stop and start the engine when the vehicle 1 is idling for a predetermined period of time. In addition, a 48V electronic load may be a driving motor, a compressor, and/or a cooling pump.

These electronic devices may also include electronic loads, such as 48V semiconductors and/or wires to accept the voltage 48V.

Accordingly, to use the voltage 48V, conventional parts for vehicle generally need to be upgraded. It is, however, inefficient to replace all the parts only to accept the voltage 48V. Considering this, the vehicle 1 employs a dual system that uses a 12V lead-acid battery and a 48V lithium-ion battery together.

The dual system requires a DC-to-DC converter for supplying suitable voltages for the respective electronic parts to suit their required capacities.

The amplifier 100 installed in the vehicle 1 also requires the DC-to-DC converter to accept the voltage 48V. However, in the case that a conventional amplifier employs the DC-to-DC converter, the amplifier increases in size and decreases in efficiency because it has the same output as in the case of using the conventional 12V.

Accordingly, the present disclosure provides embodiments of an amplifier for vehicle that uses 48V battery voltage and method for controlling the same.

Figure 4:
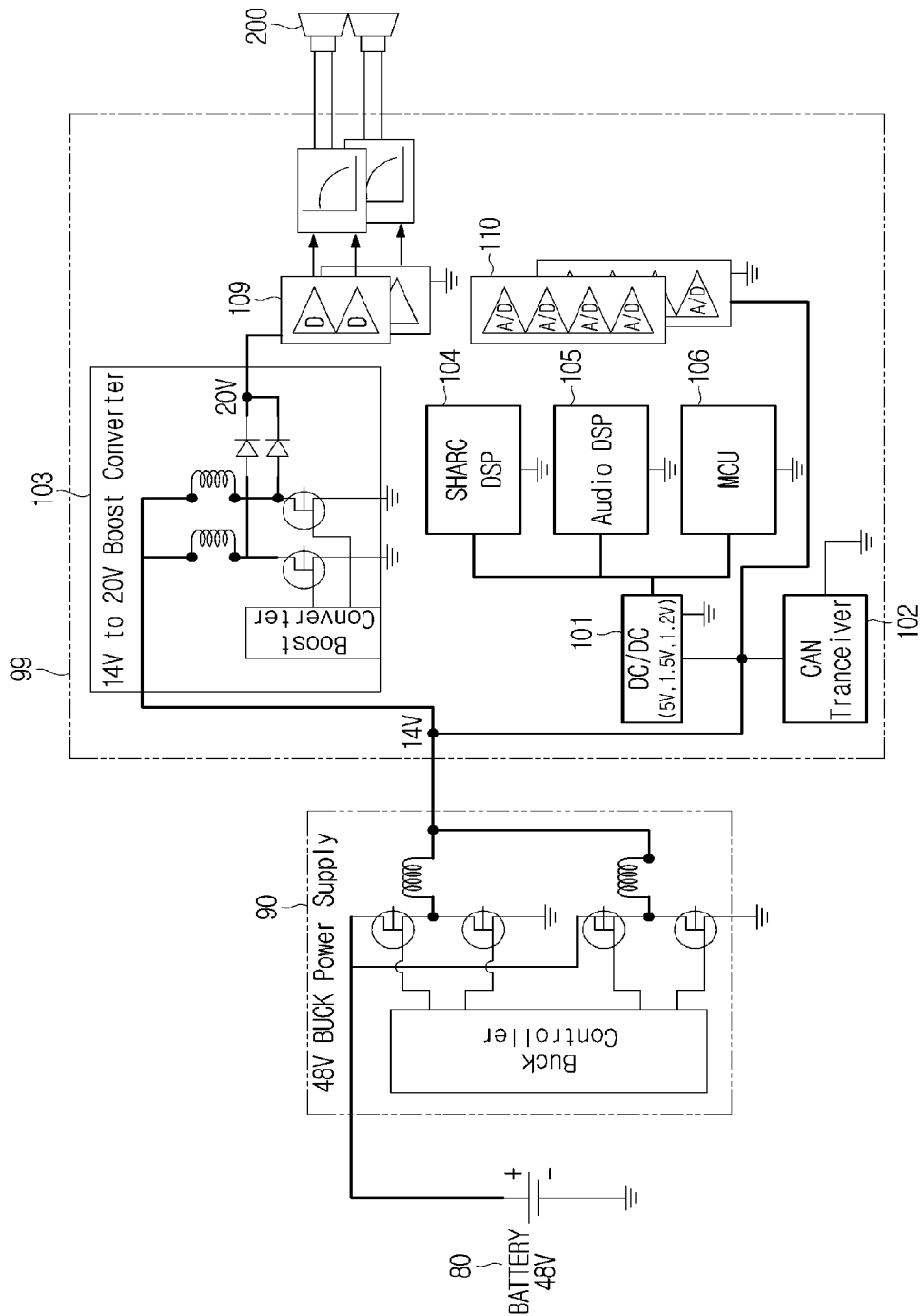
FIG. 4 illustrates a conventional amplifier having problems with the use of the voltage 48V.

FIG. 4 illustrates a conventional amplifier having problems with the use of the voltage 48V.

Referring to FIG. 4, a 48V buck power supply 90 is required to connect a conventional external amplifier 99 installed in the vehicle 1 and the 48V battery 80. This is because the parts installed in the conventional amplifier 99 are not able to accept 48V.

That is, the 48V buck power supply 90 serves to lower 48V to 14V.

A configuration of the 48V buck power supply 90 includes configuration of the conventional voltage drop device as shown in FIG. 4. Specifically, the 48V buck power supply 90 includes a buck controller, a plurality of transistors and coils.

The voltage 14V dropped by the 48V buck power supply 90 is supplied to the amplifier 99.

The conventional amplifier 99 may include a power IC 109 that accepts 20V, digital signal processors (DSP) 104, 105, 106 that accept 1.2V, 3.3V, and 5V, respectively, and another power IC 110 that accepts 14V. The power IC chip 109 that accepts 20V is a class-D type chip, serving as a low pass filter and delivering an adjusted sound signal to the speaker 200. The power IC chip 110 that accepts the voltage 14V is a class-A or B type chip, serving as a low pass filter.

The class-D type chip 110 accepts a voltage larger than 14V, and thus, has increased output. However, since the 48V buck power supply 90 drops the voltage 48V supplied by the battery 80 to 14V, the voltage 14V needs to be boosted back through a 14V-to-20V boost converter 103.

In the amplifier 99, the DSPs 104, 105, 106 operate well even at a low voltage. In other words, a high voltage may damage the DSPs 104, 105, 106. Accordingly, the amplifier 99 needs a DC-to-DC converter 101 to further drop the voltage to apply suitable voltages to the DSPs 104, 105, 106.

Eventually, even though connected to the 48V battery 80, the conventional amplifier 99 needs to reduce or re-adjust the voltage, which is not different from when it is connected to the traditional 12V and 24V batteries. Furthermore, while reducing or re-adjusting the voltage, the amplifier 99 might encounter current leakage, so it is not efficient.

Figure 5:
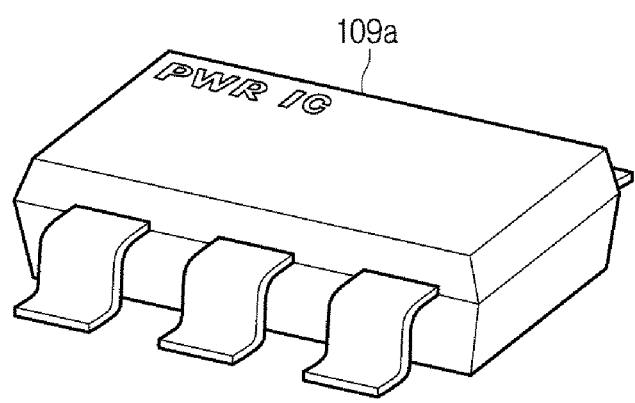
FIG. 5 illustrates a power Integrated Chip (power IC) included in an amplifier for vehicle, according to an embodiment of the present disclosure.

FIG. 5 illustrates a power IC included in an amplifier for vehicle, according to an embodiment of the present disclosure. In particular, the exterior of the power IC 109a that accepts the voltage 48V is shown in FIG. 5.

The power IC refers to a system semiconductor to convert, distribute, and manage power inside an electronic product. The power IC is a key part that is applied to power supplies for amplifiers, flat panel TVs/monitors, adapters, Light Emitting Diode (LED) lights, etc., and driving circuits, enabling module parts and their set to gain high efficiency and save power.

Power ICs used in technologies related to amplifiers may refer to output transistors. The power IC used for an amplifier serves to perform a function of DC production that cancels DC components with frequencies of about 10 Hz or less, i.e., a function of a low pass filter, and a function of junction temperature simulation (JTS) that measures the temperature between a transistor and a heat sink and drives a cooling fan when it is heated.

Today, IC technology industries are developing power ICs operable at the high voltage 48V.

When the vehicle 1 applies power to the electronic parts using the 48V battery 80, the electronic parts inside the vehicle 1 may also employ 48V power ICs. In an embodiment of the present disclosure, the amplifier 100 for vehicle also includes 48V power ICs.

Specifically, in the embodiment of the present disclosure, the amplifier 100 of the vehicle 1 may include power ICs able to accept power supplied from the 48V battery 80 without a need for a converter or buck circuit. This will be described in detail later in connection with FIGS. 6A and 6B.

In FIG. 5, only the exterior of the power IC 109a is illustrated, but the appearance of the power IC is not limited thereto, and there are no limitations on the power ICs so long as they accept the high voltage 48V.

Figure 6A:
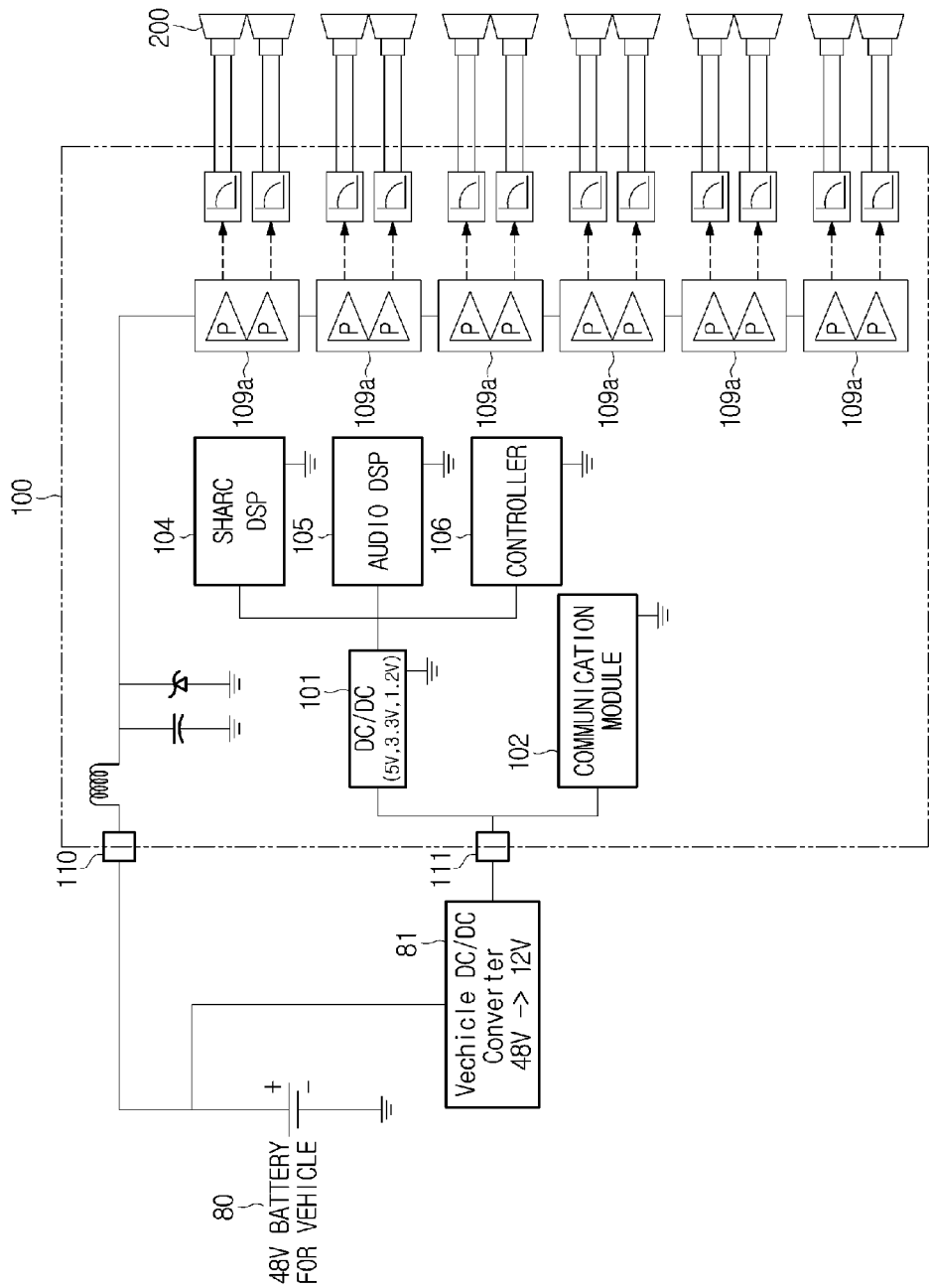
FIG. 6A is a control block diagram of an amplifier for vehicle, according to an embodiment of the present disclosure.

FIG. 6A is a control block diagram of an amplifier for vehicle, according to an embodiment of the present disclosure.

Referring to FIG. 6A, the amplifier 100 may include a DC-to-DC converter 101 for dropping the voltage 48V, a communication module 102 for communicating with other ECUs in the vehicle 1, a SHARC DSP 104, an audio DSP 105, and a controller 106 for controlling them, which operate at voltages dropped by the DC-to-DC converter 101.

The amplifier 100 may also include power ICs 109a, which are described above in connection with FIG. 5. The power ICs 109a may be connected to speakers 200.

Specifically, the amplifier 100 may include two input ports receiving the voltage 48V, and a voltage lower than 48V, e.g., 12V. In other words, the amplifier 100 includes a first input port 110 receiving 48V, and a second input port 111 receiving a voltage lower than 48V.

In an embodiment of the present disclosure, the vehicle 1 may include the 48V battery 80, and the DC-to-DC converter 81 for dropping the voltage 48V.

The DC-to-DC converter 81 may serve to reduce the voltage applied from the 48V battery 80. The DC-to-DC converter 81 may also deliver the reduced voltage to the second input port 111 of the amplifier 100.

As described above, the amplifier 100 receives the voltage 48V, and a voltage lower than 48V. For example, in an embodiment, the DC-to-DC converter 81 installed in the vehicle 1 may drop the voltage 48V and apply the dropped voltage to the amplifier 100.

In FIG. 6A, the voltage lower than 48V is 12V, but is not limited thereto and may have any level.

In another embodiment of the present disclosure, the vehicle 1 may include a 12V battery 70 instead of the DC-to-DC converter 81. This will be described later in connection with FIG. 6B.

The voltage 48V applied to the first input port 111 of the amplifier 100 is delivered to the power IC 109a through a common component of the amplifier 100, such as an inductor.

The power IC 109a installed in the amplifier 100 may accept the voltage 48V and operate at the voltage in contrast to the conventional amplifier 99. That is, the power IC 109a may serve as a low pass filter to control an audio signal delivered from the audio DSP 105.

In the amplifier 100, operation of the power IC 109a is similar to the operation of the IC as described above in connection with FIG. 4. The power IC 109a may, however, have an effect of omitting the 14V-to-20V boost converter 103 that is required in the conventional amplifier 14V, and may have increased efficiency and output.

The power IC 109a of the amplifier 100 of FIG. 6A may include two class-D type power ICs. That is, the amplifier 100 may include twelve channels only by way of example.

In the embodiment of the present disclosure, the amplifier 100 may receive the voltage 12V applied from the vehicle 1 through the second input port 111. The voltage 12V applied through the second input port 111 may be delivered to control devices in the amplifier 100.

The amplifier 100 may include control modules for controlling general operation of the amplifier 100. For example, the modules may include the communication module 102, and a plurality of DSPs 104, 105, 106.

The communication module 102 and the plurality of DSPs 104, 105, 106 are not required to use high voltages, e.g., around 48V, taking into account the characteristics of their constituent components. Accordingly, a low voltage around 12V may be applied to the amplifier 100 through the second input port 111.

That is, the amplifier 100 may increase the output efficiency by using the power IC 109a that operates at 48V, and increases operation efficiency by applying the low voltage 12V to the other control devices.

Specifically, the amplifier 100 that uses the voltage 12V may be configured to include a communication module 102 for communicating with other ECUs in the vehicle 1, a DC-to-DC converter 101 for dropping 12V, a SHARC DSP 104, an audio DSP 105, and a controller 106, which operate at 1.2V, 3.3V, and 5V, respectively, dropped by the DC-to-DC converter 101.

The communication module 102 has a function to communicate with other ECUs in the vehicle 1. For example, the amplifier 100 may exchange data with the AVN device 51 or the head unit. In another example, the amplifier 100 may be a node in a network, to which Controller Area Network (CAN) messages of the vehicle 1 are delivered.

The vehicle 1 may include a plurality of ECUs, and a CAN is an example of a network over which the ECUs exchange data to one another. The amplifier 100 installed in the vehicle 1 may thus also include the communication module 102 to communicate with other ECUs.

The amplifier 100 may use various communication networks, such as a Local Interconnect Network (LIN) in addition to the CAN, and the communication module 102 is not limited to what is shown in FIG. 6A.

In an embodiment of the present disclosure, the amplifier 100 may include various DSPs.

DSP refers to a data processing scheme, by which analog signal information is converted to digital signals represented in 0's and 1's, which may be processed by mathematical operation. The DSPs of the amplifier 100 refer to modules for processing data.

For example, the DSP of the amplifier 100 may perform filtering, amplification, noise cancellation, signal creation, signal detection, and feature detection for a particular signal.

Analog signals have various problems with signal processing by an analog circuit, e.g., problems of external noise, low processing rate, limited bandwidth, etc. Accordingly, processing digital signals converted from the analog signals may prevent signal distortion and loss.

In an embodiment of the present disclosure, the amplifier 100 may include the SHARC DSP 104 and the audio DSP 105.

Specifically, the SHARC DSP 104 may perform tuning or coding on audio sound. In an embodiment, the SHARC DSP 104 may perform the same function as what is performed by the DSP installed in the conventional amplifier 99.

The audio DSP 105 may control output of the speaker 200 connected to the amplifier 100.

For example, if there is a need to adjust audio output, the controller 106 sends a control signal to the audio DSP 105, which in turn controls the power IC 109a according to the control signal. As a result, the audio DSP 105 may control the volume of the sound output from the speaker 200.

The SHARC DSP 104 and the audio DSP 105 may even operate at at least one of the voltages, 1.2V, 3.3V, and 5V. The DC-to-DC converter 101 included in the amplifier 100 drops the voltage 12V delivered from the second input port 111 to supply suitable power to the respective DSPs.

The aforementioned voltages, 1.2V, 3.3V, and 5V are only by way of example, and there may be other various voltage levels to be used in some embodiments of the present disclosure.

The controller 106 is a kind of processor for controlling general operation of the amplifier 100.

Specifically, the controller 106 may monitor volume of an audio source (or max output power) sent from the AVN device 51 or the head unit. If the volume of a source may be output at low power, the controller 106 may control the audio DSP 105 to regulate the power IC 109a. In this way, the controller 106 may efficiently control output of the amplifier 100. This will be described in detail later in connection with FIG. 7.

The controller 106 may operate at at least one of the voltages, 1.2V, 3.3V, and 5V. Specifically, the DC-to-DC converter 101 included in the amplifier 100 drops the voltage 12V delivered from the second input port 111 to at least one of the voltages, 1.2V, 3.3V, and 5V, and the controller 106 operates at the dropped voltage.

In the meantime, the controller 106 may be integrated with a storage medium that may store data, in a System on Chip (SoC) embedded in the amplifier 100. In this regard, there may be not only one but multiple SoCs embedded in the amplifier 100, and the aforementioned components may not be limited to being integrated in a single SoC.

Figure 6B:
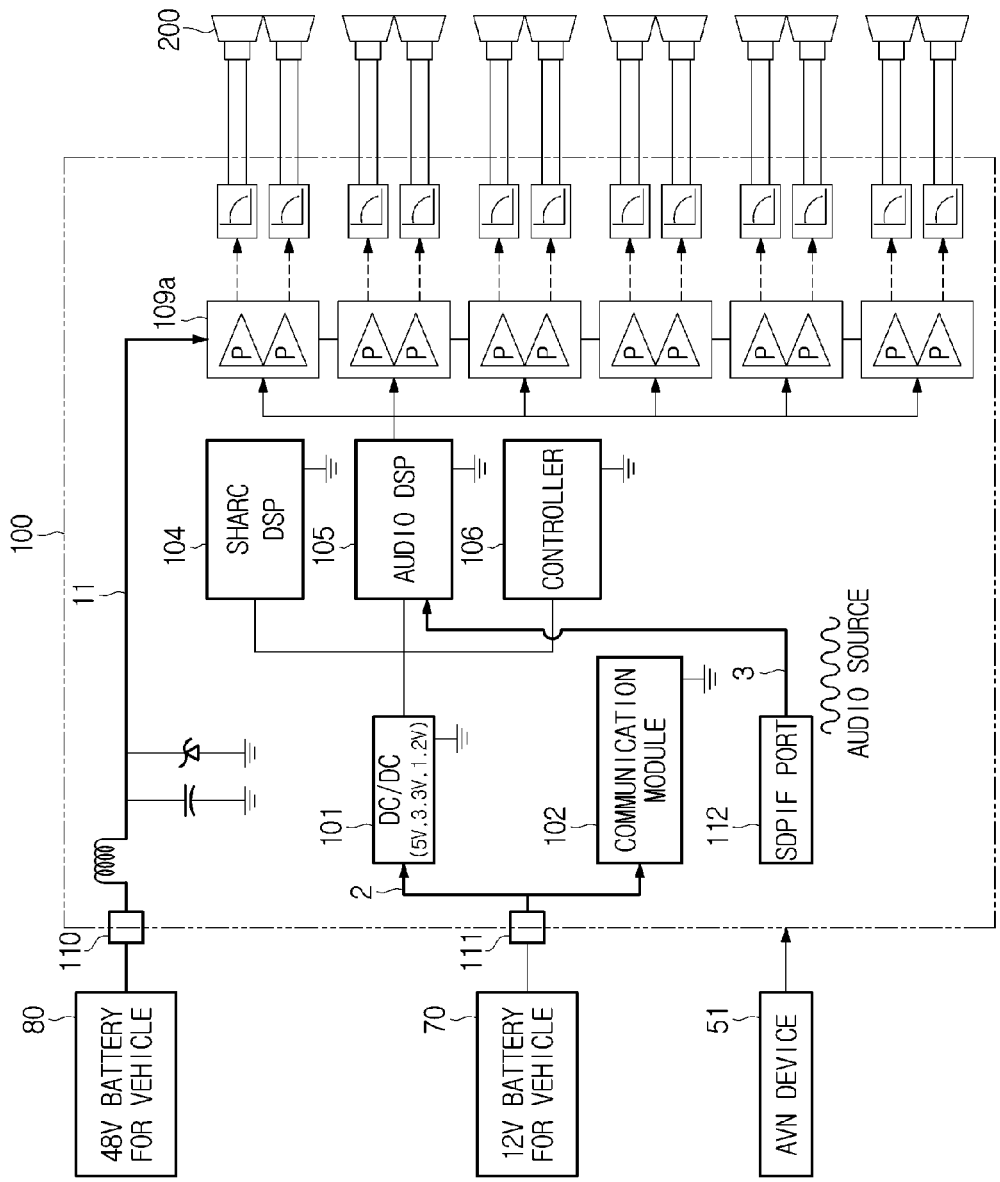
FIG. 6B is a control block diagram of an amplifier for vehicle, according to another embodiment of the present disclosure.

FIG. 6B is a control block diagram of an amplifier for vehicle, according to another embodiment of the present disclosure. Description overlapping with FIG. 6A will be omitted herein.

Referring to FIG. 6B, the vehicle 1 may include the 12V battery 70.

The voltage 12V supplied by the battery 70 may be applied to the DC-to-DC converter 101 and the communication module 102 through the second input port 111.

The DC-to-DC converter 101 may drop the voltage 12V as described above in connection with FIG. 6A, and apply the dropped voltage to the DSPs 104, 105. The communication module 102 may communicate with other ECUs in the vehicle 1 using the voltage 12V.

The amplifier 100 may include an SPDIF port 112.

SPDIF is an abbreviation of Sony Phillips Digital Interface, a kind of digital port standard. Its official name is IEC958-TYPE, which is defined in EIAJ. For common devices, all digital ports are defined to correspond to the SPDIF.

Specifically, since analog connection schemes are implemented not for sound but only for video, the SPDIF port 112 may be additionally used to convert the sound signal to a digital signal. That is, a port standard defined when an analog sound signal is converted to a digital signal is the SDPIF.

The amplifier 100 installed in the vehicle 1 may include a port, the SPDIF port 112 for outputting digital sound. Accordingly, the AVN device 51 or the head unit of the vehicle 1 may deliver an audio source to the amplifier 100 through the SPDIF port 112, and the audio source may be converted into a digital signal through the SDPIF.

The SPDIF port 112 and even modules connected thereto may operate at 12V or at a dropped voltage 5V.

The SPDIF port 112 may deliver the audio source to the audio DSP 105. In general, the audio DSP 105 in the amplifier reproduces the audio source sent from the audio DSP 105 through the speaker 200.

In this regard, the controller 106 may monitor the audio source delivered, and control the audio DSP 105 to adjust the output of the speaker 200.

Specifically, the audio DSP 105 may deliver a power level of the audio source delivered from the SDPIF port 112 to the controller 106. The controller 106 determines the level of a voltage used for output of the speaker 200 based on the audio source. If the determined voltage level is higher than an acceptable input voltage, the controller 106 may control the audio DSP 105 to reduce the volume of the speaker 200. Accordingly, the audio DSP 105 may regulate the power IC 109a to control the output of the speaker 200. As a result, voltage controlled by the controller 106 is the voltage from the 48V battery 80 applied through the first input port 110 of the amplifier 100.

Referring to FIG. 6B, as for an arrow 11, the voltage 48V applied through the first input port 110 is directly supplied to the power IC 109a. That is, unlike the conventional amplifier using 12V, the amplifier 100 in the embodiment of the present disclosure uses 48V. Accordingly, the amplifier 100 may operate with higher output efficiency than the conventional amp 99.

As for an arrow 2, the 12V battery 70 delivers power through the second input port 111. The voltage 12V is applied to the communication module 102, the DSPs 104, 105, and the controller 106. In this way, the respective modules of the amplifier 100 may efficiently use the power.

As for an arrow 3, the AVN device 51 or the head unit sends an audio source to the audio DSP 105. Specifically, the controller 106 may monitor an audio power level from the SPDIF port 112, and control the audio DSP 105 to manage the voltage 48V directly applied to the first input port 110.

Advantages and effects of the present disclosure will be described in detail later in connection with FIG. 8.

Details about the operation of the controller 106 will now be described in connection with FIG. 7.

Figure 7:
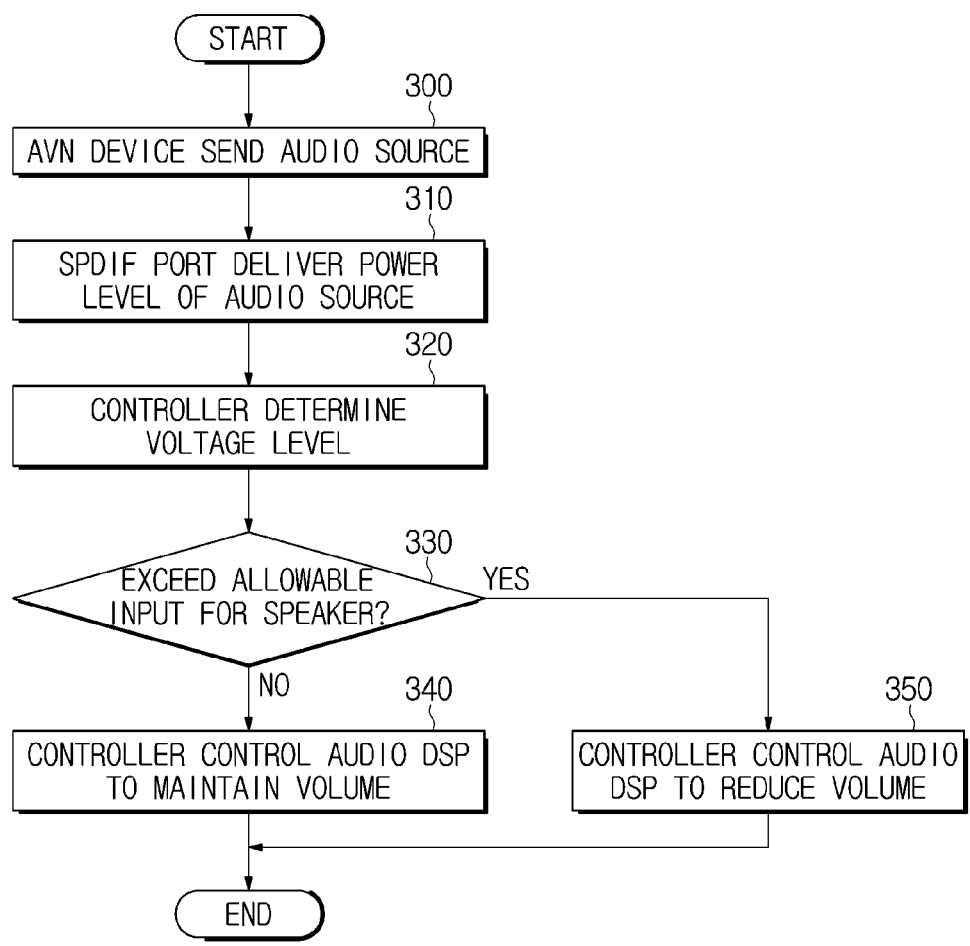
FIG. 7 is a flowchart illustrating a power management method, according to an embodiment of the present disclosure.

FIG. 7 is a flowchart illustrating a power management method, according to an embodiment of the present disclosure.

Referring to FIG. 7, the AVN device 51 delivers an audio source to the amplifier, in 300.

Specifically, the AVN device 51 or the head unit of the vehicle 1 may deliver the audio source through the SPDIF port 112. Alternatively, the AVN device 51 or the head unit may deliver the audio source through the communication module 102. That is, it is not necessary for the audio source to be delivered only through the SPDIF port 112 of the amplifier 110, but the audio source may be delivered through any other module or port, without limitation.

The power level of the audio source determined at the SPDIF port 112 is delivered to the controller 106, in 310.

The controller 106 monitors the delivered audio source. Specifically, the controller 106 monitors a power level required for output of the power IC 109a based on the audio source sent by the audio DSP 105.

Accordingly, the controller 106 determines a voltage level required to operate the amplifier 100, in 320.

The controller 106 determines whether the determined voltage level is within an allowable input range for the speaker 200, in 330.

If the determined voltage level is not out of the allowable input range for the speaker 200, the controller 106 controls the audio DSP 105 to maintain the volume state for the speaker 200, in 340.

If the determined voltage level is out of the allowable input range for the speaker 200, the controller 106 controls the audio DSP 105 to reduce the volume for the speaker 200, in 350.

For example, the controller 106 adjusts the voltage 48V input to the power IC 109a based on the allowable input range for the speaker 200. In this way, the amplifier 100 is able to efficiently manage the power.

FIG. 8 is a table for explaining effects of an amplifier for vehicle, according to an embodiment of the present disclosure.

Referring to FIG. 8, the amplifier 100 for vehicle has the following technological characteristics.

Specifically, the amplifier 100 includes the first input port 110 receiving 48V battery voltage, and the second input port 111 for receiving a voltage lower than 48V, e.g., 12V.

Furthermore, the amplifier 100 applies the voltage 48V received through the first input port 110 directly to the power IC 109a without boosting or dropping the voltage.

The controller 106 of the amplifier 100 determines a power level of an input audio source, and adjusts the volume of the speaker 200, thereby increasing efficiency of the voltage 48V applied through the first input port 110.

Referring back to FIG. 4, the conventional amplifier 99 installed in the vehicle 1 includes a power IC that accepts the voltage 20V, and requires a buck power supply 90 to drop the voltage 48V. The conventional amplifier 99 also requires a DC-to-DC boost converter 103 for boosting the voltage 12V to 14V dropped by the buck power supply 90 to 35V.

In terms of the first technological characteristic of the amplifier 100 in the embodiment of the present disclosure, as compared to the conventional amplifier 99, the amplifier 100 may be configured without the buck power supply 90 and the DC-to-DC boost converter 103, thereby reducing the size of the entire amplifier system required in the vehicle 1 and saving the cost.

Referring to FIG. 8, a second technological characteristic of the amplifier 100 is directly connecting the voltage of the 48V battery 80 to the power IC 109a.

Turning back to FIG. 4, the conventional amplifier 99 includes the power IC 109 that uses 20V. Accordingly, the conventional amplifier 99 needs an extra IC to increase its output.

Referring to FIG. 8, in terms of the second characteristics, the amplifier 100 may not need any extra IC to increase its output and may reduce a conversion loss because the voltage 48V is directly applied to the power IC 109a, as compared to the conventional amplifier 99. Specifically, with a minimized conversion loss, the amplifier 100 may have an efficiency increased by about 90 percent.

Direct application of the voltage 48V to the power IC 109a may even reduce the diameter of wires. That is, the current reduced by a higher voltage leads to reduction in diameter of wires. For example, with the voltage 48V directly applied to the power IC 109*a*, a required current 23.2 A may decrease to 9 A, thereby increasing the efficiency of the amplifier by about 38 percent.

In an embodiment of the present disclosure, the controller 106 of the amplifier 100 monitors an audio power level, and controls the audio DSP 105 to manage the voltage 48V directly applied to the first input port 110.

That is, the controller 106 may adjust the volume of the speaker 200 connected to the amplifier 100, and the amplifier 100 may plan efficient power operation.

According to embodiments of an amplifier for vehicle, vehicle including the amplifier, and method for controlling the amplifier for vehicle, a 48V battery voltage is used and speaker output is adjusted by variable audio signals, thereby minimizing the size of an external amplifier, reducing conversion loss of a DC-to-DC converter, and increasing output efficiency.

What is claimed is:

1. An amplifier for vehicle comprising:
a first input port for receiving a first voltage;
a second input port for receiving a second voltage lower than the first voltage;
at least one power Integrated Chip (power IC) connected to a speaker, the power IC for receiving a voltage received from the first input port; and
a controller for controlling the power IC using a voltage received from the second input port.

2. The amplifier for vehicle of claim 1, further comprising:
an audio digital signal processor (DSP) for receiving an audio source delivered to the amplifier and determining a sound source level based on the audio source.

3. The amplifier for vehicle of claim 2, wherein the controller is configured to control an extent of amplification of the power IC based on the sound source level determined by the audio DSP.

4. The amplifier of claim 3, wherein the controller is configured to control the audio DSP to decrease the sound source level, in response to a determination that the extent of amplification of the power IC based on the sound source level exceeds an allowable input level of the speaker.

5. The amplifier for vehicle of claim 1, further comprising:
a direct current (DC)-to-DC converter for dropping the second voltage received through the second input port.

6. The amplifier for vehicle of claim 5, further comprising an audio digital signal processor (DSP) for receiving an audio source delivered to the amplifier and determining a sound source level based on the audio source,
wherein the audio DSP and the controller are configured to operate at a voltage applied by the DC-to-DC converter.

7. A vehicle comprising:
a battery for supplying a voltage;
a first direct current (DC)-to-DC converter that drops a first voltage applied by the battery;
an amplifier that operates at a voltage applied by the battery; and
a speaker that outputs sound based on the operation of the amplifier,
wherein the amplifier comprises:
a first input port for receiving the first voltage;
a second input port for receiving a second voltage dropped by the first DC-to-DC converter;
at least one power Integrated Chip (power IC) connected to the speaker, the power IC for receiving a voltage received from the first input port; and
a controller for controlling the power IC using a voltage received from the second input port.

8. The vehicle of claim 7, further comprising:
an audio digital signal processor (DSP) for receiving an audio source delivered to the amplifier and determining a sound source level based on the audio source.

9. The vehicle of claim 8, wherein the controller is configured to control an extent of amplification of the power IC based on the sound source level determined by the audio DSP.

10. The vehicle of claim 9, wherein the controller is configured to control the audio DSP to decrease the sound source level, in response to a determination that the extent of amplification of the power IC based on the sound source level exceeds an allowable input level of the speaker.

11. The vehicle of claim 7, wherein the first voltage comprises a 48V battery voltage.

12. The vehicle of claim 7, further comprising an audio digital signal processor (DSP) for receiving an audio source delivered to the amplifier and determining a sound source level based on the audio source,
wherein the amplifier comprises a second DC-to-DC converter for further dropping the second voltage received through the second input port.

13. The vehicle of claim 12, wherein the audio DSP and the controller are configured to operate at a voltage applied by the second DC-to-DC converter.

14. A vehicle comprising:
a first battery that supplies a first voltage;
a second battery that supplies a voltage lower than the first voltage supplied by the first battery;
an amplifier that operates at voltages supplied by the first and second batteries; and
a speaker that outputs sound based on the operation of the amplifier,
wherein the amplifier comprises:
a first input port for receiving the first voltage;
a second input port for receiving a second voltage lower than the first voltage;
at least one power Integrated Chip (power IC) connected to the speaker, the power IC for receiving a voltage received from the first input port; and
a controller for controlling the power IC using a voltage received from the second input port.

15. The vehicle of claim 14, further comprising:
an audio digital signal processor (DSP) for receiving an audio source delivered to the amplifier and determining a sound source level based on the audio source.

16. The vehicle of claim 15, wherein the controller is configured to control an extent of amplification of the power IC based on the sound source level determined by the audio DSP.

17. The vehicle of claim 16, wherein the controller is configured to control the audio DSP to decrease the sound source level, in response to a determination that the extent of amplification of the power IC based on the sound source level exceeds an allowable input level of the speaker.

18. The vehicle of claim 14, wherein the first voltage comprises a 48V battery voltage.

19. The vehicle of claim 14, further comprising an audio digital signal processor (DSP) for receiving an audio source delivered to the amplifier and determining a sound source level based on the audio source,
wherein the amplifier comprises a direct current (DC)-to-DC converter for further dropping the second voltage received through the second input port.

20. The vehicle of claim 19, wherein the audio DSP and the controller are configured to operate at a voltage applied by the DC-to-DC converter.

\* \* \* \* \*